US011686798B2

United States Patent
Roberts

(10) Patent No.: US 11,686,798 B2
(45) Date of Patent: Jun. 27, 2023

(54) SYSTEM AND METHOD FOR CONTROLLING CONCOMITANT GRADIENT PHASE ERRORS IN CHEMICAL-SHIFT ENCODED IMAGING

(71) Applicant: WISCONSIN ALUMNI RESEARCH FOUNDATION, Madison, WI (US)

(72) Inventor: Nathan Tibbitts Roberts, Madison, WI (US)

(73) Assignee: WISCONSIN ALUMNI RESEARCH FOUNDATION, Madison, WI (US)

( * ) Notice: Subject to any disclaimer, the term of this patent is extended or adjusted under 35 U.S.C. 154(b) by 0 days.

(21) Appl. No.: 17/489,698

(22) Filed: Sep. 29, 2021

(65) Prior Publication Data
US 2023/0095599 A1    Mar. 30, 2023

(51) Int. Cl.
| | |
|---|---|
| G01R 33/48 | (2006.01) |
| G01R 33/485 | (2006.01) |
| G01R 33/56 | (2006.01) |
| G01R 33/565 | (2006.01) |
| G01R 33/44 | (2006.01) |
| G01R 33/385 | (2006.01) |

(52) U.S. Cl.
CPC ......... *G01R 33/485* (2013.01); *G01R 33/385* (2013.01); *G01R 33/445* (2013.01); *G01R 33/4828* (2013.01); *G01R 33/5608* (2013.01); *G01R 33/56518* (2013.01); *G01R 33/56527* (2013.01)

(58) Field of Classification Search
CPC .. G01R 33/485; G01R 33/385; G01R 33/445; G01R 33/4828; G01R 33/5608; G01R 33/56518; G01R 33/56527
See application file for complete search history.

(56) References Cited

U.S. PATENT DOCUMENTS

| | | |
|---|---|---|
| 9,625,549 B2 | 4/2017 | Hernando |
| 10,393,838 B2 | 8/2019 | Hernando |
| 2017/0181656 A1* | 6/2017 | Reeder .................. A61B 5/055 |

OTHER PUBLICATIONS

WO-2016180983-A1 (Year: 2016).*
Ruschke, et al., "Correction of Phase Errors in Quantitative Water-Fat Imaging Using a Monopolar Time-Interleaved Multi-Echo Gradient Echo Sequence", Magnetic Resonance in Medicine, 78:984-996,2017.

(Continued)

*Primary Examiner* — G. M. A Hyder
(74) *Attorney, Agent, or Firm* — Quarles & Brady LLP

(57) ABSTRACT

A system and method are provided for magnetic resonance imaging (MRI) and/or image reconstruction that includes acquiring multi-pass, chemical shift-encoded (CSE)-MRI imaging data of a subject. The method further includes performing a complex, joint estimation of phase terms in the imaging data for each pass of the multi-pass, CSE-MRI imaging data to account for concomitant gradient (CG)-induced phase errors of different passes. The method also includes generating at least one of a proton density fat fraction (PDFF) estimate or an R2* estimate that is unbiased by CG-induced phase errors using the phase terms and communicating a report that includes at least one of the PDFF estimate or the R2* estimate.

16 Claims, 9 Drawing Sheets
(6 of 9 Drawing Sheet(s) Filed in Color)

(56) References Cited

OTHER PUBLICATIONS

Colgan, et al., "The Effects of Concomitant Gradients on Chemical Shift Encoded MRI", Magnetic Resonance in Medicine, 78:730-738,2017.
Bernstein, et al., "Concomitant Gradient Terms in Phase Contrast MR: Analysis and Correction" MRM 39:300-308, 1998.
Ruschke, et al., "Addressing phase errors in quantitative water-fat imaging at 3 T using a time-interleaved multi-echo gradient-echo acquisition", Proc. Inti. Soc. Mag. Reson. Med. 23, 2015.
Campo, et al., "Standardized Approach for ROI-Based Measurements of Proton Density Fat Fraction and R2* in the Liver". AJR Am J Roentgenol. Sep. 2017;209(3):592-603. doi: 10.2214/AJR. 17.17812. Epub Jul. 1, 20173. PMID 28705058; Pmcid: PMC5639884.

\* cited by examiner

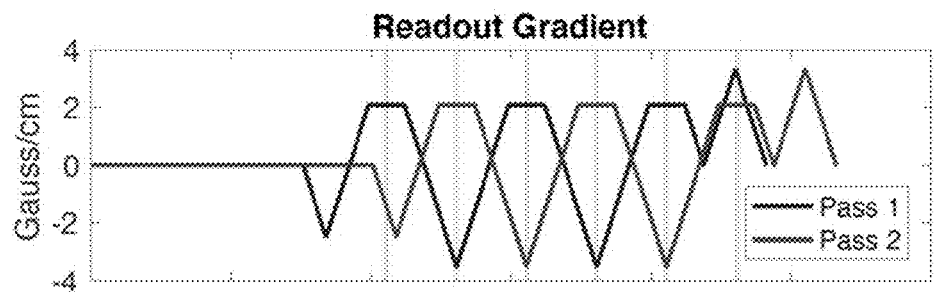
FIG. 3A
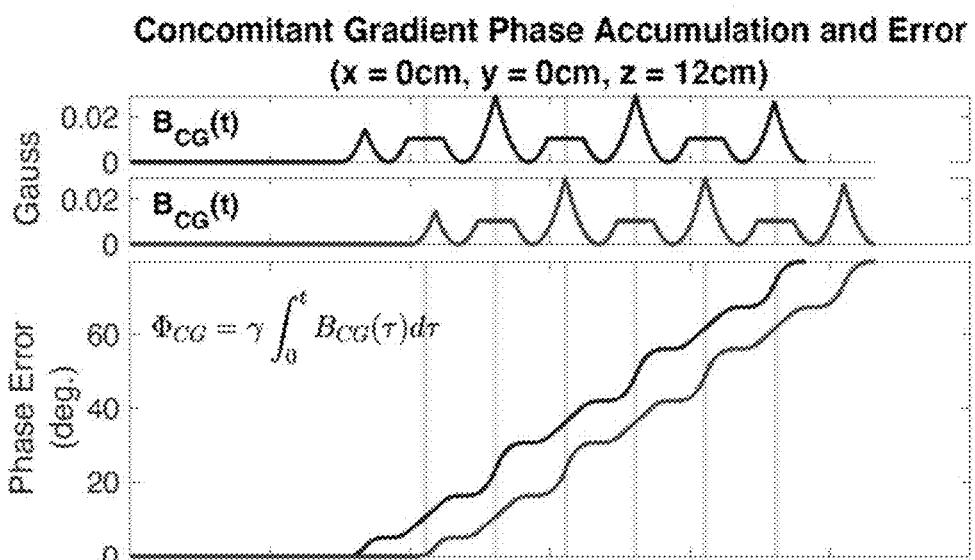
FIG. 3B
FIG. 3C
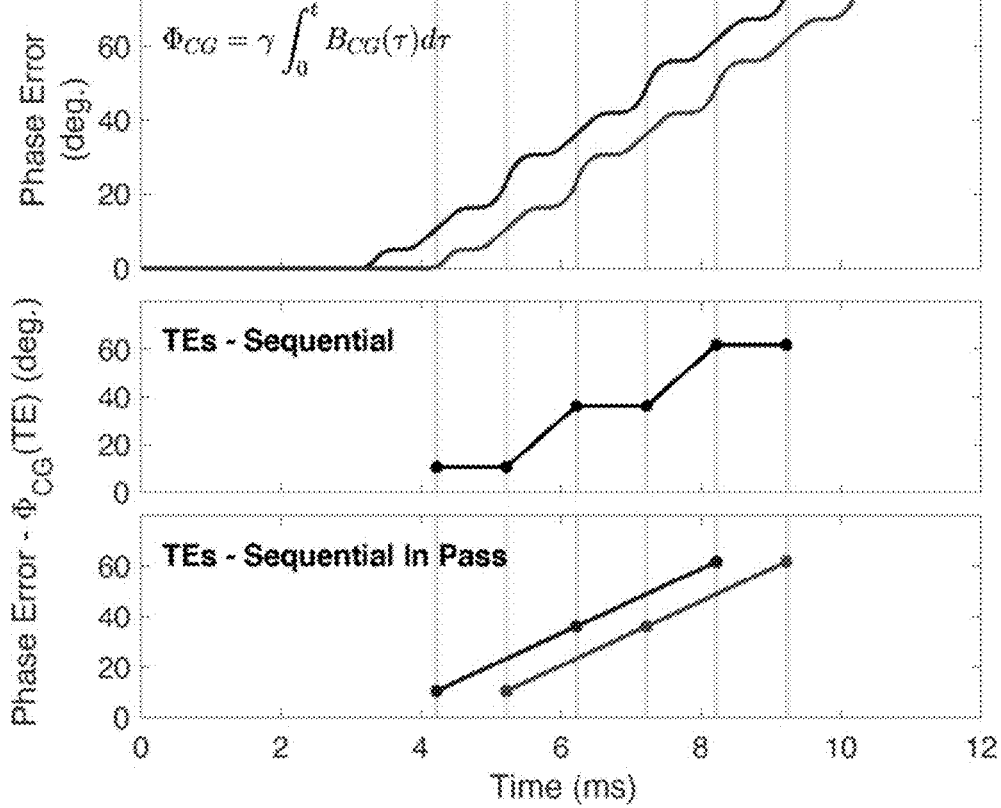
FIG. 3D
FIG. 3E

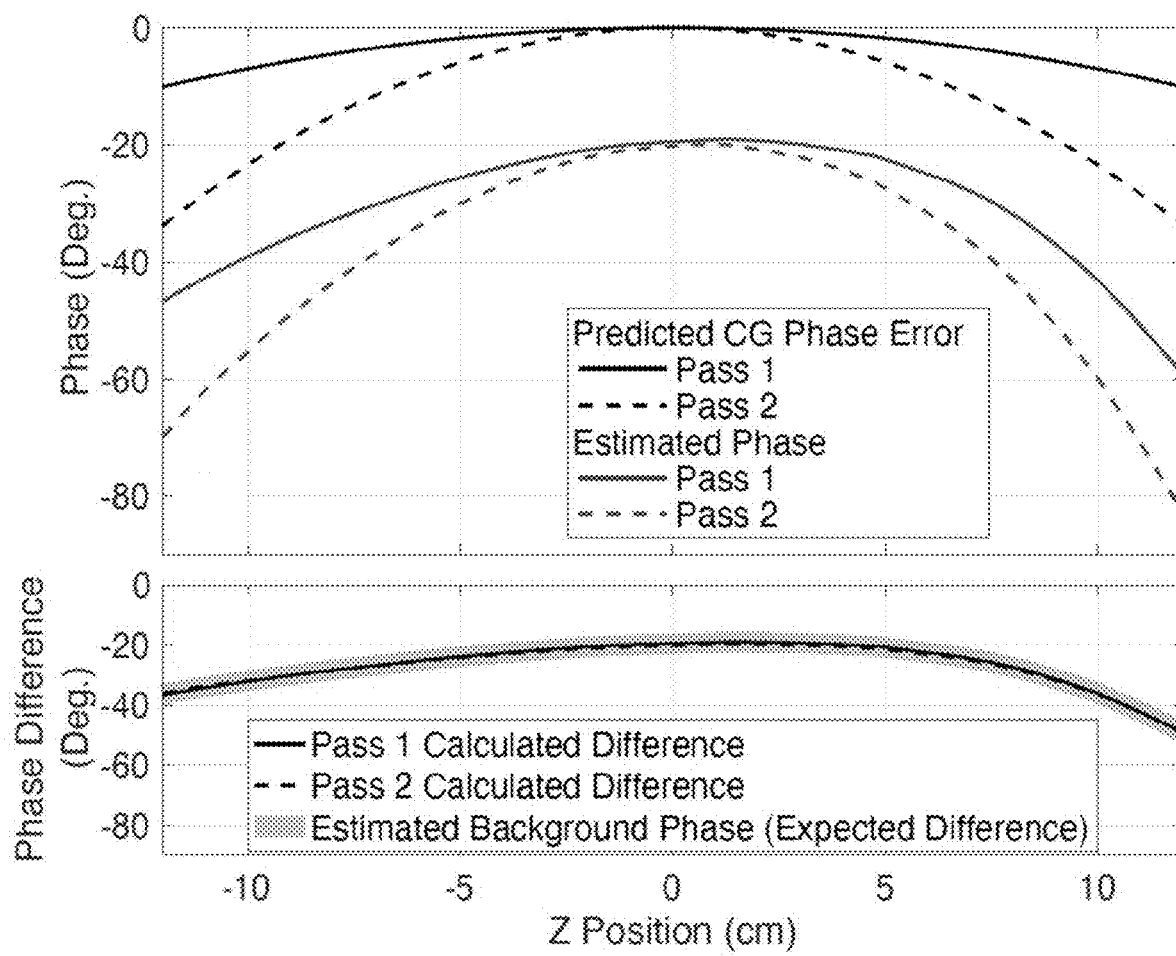

SYSTEM AND METHOD FOR CONTROLLING CONCOMITANT GRADIENT PHASE ERRORS IN CHEMICAL-SHIFT ENCODED IMAGING

STATEMENT REGARDING FEDERALLY SPONSORED RESEARCH

This invention was made with government support under DK088925 and DK100651 awarded by the National Institutes of Health. The government has certain rights in the invention.

BACKGROUND

The present disclosure relates generally to systems and methods for magnetic resonance imaging ("MRI"). More particularly, the invention relates to systems and methods for controlling phase errors in chemical-shift encoded MRI.

When a substance, such as human tissue, is subjected to a uniform magnetic field (polarizing field B0), the individual magnetic moments of the nuclei in the tissue attempt to align with this polarizing field, but precess about it in random order at their characteristic Larmor frequency. If the substance, or tissue, is subjected to a magnetic field (excitation field Bi) that is in the x-y plane and that is near the Larmor frequency, the net aligned moment, $M_z$, may be rotated, or "tipped", into the x-y plane to produce a net transverse magnetic moment $M_{xy}$. A signal is emitted by the excited nuclei or "spins", after the excitation signal Bi is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well-known reconstruction techniques.

To do so, the signals are often weighted in different ways to give preference to or consider different sub-signals or so-called contrast mechanisms. Two basic "contrast mechanisms" commonly utilized in MR imaging are the spin-lattice (or longitudinal or T1) relaxation time or spin-spin (or transverse or T2) relaxation time. The T1 and T2 contrast mechanism are the two most important relaxation mechanisms commonly exploited to provide soft tissue contrast in clinical MRI examinations. Both T1- and T2-weighted (T1w, T2w) acquisitions play a ubiquitous role in almost every clinical MRI exam and are important for a variety of applications including lesion detection, characterization, treatment monitoring, and many other applications. However, there are a variety of other mechanisms for eliciting contrast in MRI, including R2*. Specifically, T2*(1/R2*) is a quantity related to T2, but including dephasing effects. That is, T2* is a quantity related to spin-spin relaxation and, in addition, relating magnetic field inhomogeneities and susceptibility effects.

Multi-echo chemical shift-encoded (CSE)-MRI is an established method for measuring confounder-corrected proton density fat fraction (PDFF) and R2* as biomarkers of tissue fat and iron content, respectively. PDFF is a fundamental property of tissue reflecting triglyceride concentration and is an established biomarker of liver fat content. PDFF is well-established for the detection, staging, and treatment monitoring of hepatic steatosis and nonalcoholic fatty liver disease. Left untreated, nonalcoholic fatty liver disease can progress to end-stage liver disease including cirrhosis and hepatocellular carcinoma. Complex confounder-corrected R2*, which can be estimated simultaneously with PDFF, is an emerging biomarker of liver iron concentration. Excess iron accumulation is toxic and can also lead to liver damage, cirrhosis, liver failure and hepatocellular carcinoma.

CSE-MRI can use magnitude-based or complex-based techniques for parameter estimation; however, magnitude-based techniques suffer from decreased signal-to-noise ratio (SNR) performance and difficulty estimating PDFF over the complete 0-100% dynamic range. While this makes complex-based techniques preferable for accurate and precise quantification, they are confounded by a variety of phase errors that can lead to significant estimation bias. Though there are a variety of different sources for these errors, one source of phase error is concomitant gradients (CG).

CG phase errors are particularly problematic for multi-pass CSE-MRI, where time-interleaved, multi-echo gradient-echo acquisitions are acquired in two or more TRs (i.e., passes) instead of sequentially in a single TR (i.e., single-pass acquisitions). Clinically, multi-pass acquisitions are used routinely for CSE-MRI in the liver at 3.0 Tesla, because they permit high spatial resolution while maintaining optimal echo spacing. Even after routine linear phase-error corrections are applied to address common sources of phase-errors (such as eddy currents or system timing imperfections), CG phase errors can cause significant spatially varying bias in multi-pass CSE-MRI acquisitions used to estimate B0 field map, R2*, and PDFF.

While methods have been proposed to correct CSE-MRI multi-pass acquisitions for CG phase errors (e.g., Ruschke S, Eggers H, Kooijman H, et al. Addressing phase errors in quantitative water-fat imaging at 3 T using a time-interleaved multi-echo gradient-echo acquisition. In: Proceedings of the 23rd Annual Meeting of ISMRM. Toronto, Ontario, Canada; p. 3657; Colgan T J, Hernando D, Sharma S D, Reeder S B. The effects of concomitant gradients on chemical shift encoded MRI. Magn. Reson. Med. 2017; 78:730-738 doi: https://doi.org/10.1002/mrm.26461; and Ruschke S, Eggers H, Kooijman H, et al. Correction of phase errors in quantitative water-fat imaging using a monopolar time-interleaved multi-echo gradient echo sequence. Magn. Reson. Med. 2017; 78:984-996 doi: doi.org/10.1002/mrm.26485), correction requires accurate knowledge of the physical gradient waveform amplitudes and timing in true imaging coordinates. At best, this complicates the reconstruction pipeline by requiring direct communication between the pulse sequence waveform algorithm and the reconstruction algorithm. At worst, detailed knowledge of the pulse sequence waveforms may be inaccessible due to proprietary software licenses or other reasons. Furthermore, even if perfect knowledge of the pulse sequence is available, the dependencies across the acquisition-to-reconstruction pipeline are often too complicated navigate.

Thus, there is a need for systems and methods that overcome the challenges with phase errors in CSE-MRI studies and/or otherwise provide accurate PDFF and R2* estimates.

SUMMARY

The present disclosure overcomes the aforementioned drawbacks by providing systems and methods for addressing concomitant gradient phase errors in chemical shift-encoded (CSE)-MRI. For example, the present disclosure provides systems and methods for a complex-based, independent-phase fitting to address concomitant gradient phase errors for proton density fat fraction (PDFF) and R2* estimations. The systems and methods provided herein are able to do so without the need for prior knowledge of gradient waveforms and the need to manage interdependencies across the acquisition-to-reconstruction pipeline, which allows proper calculations from previously-acquired MR data where the gradients waveforms were lost or not available, or using currently- or recently-acquired MR data without needing to be integrated with proprietary systems of a particular manufactures' systems. As such, the systems and methods provided herein do not need to be integrated with the MR system or have proprietary information, thus, providing solutions that span all MR systems, not just one manufacturer or model.

In accordance with one aspect of the disclosure, a magnetic resonance imaging (MRI) system is provided that includes a magnet system configured to generate a polarizing magnetic field about at least a portion of a subject arranged in the MRI system, a plurality of gradient coils configured to apply magnetic gradients to the polarizing magnetic field, and a radio frequency (RF) system configured to apply an excitation field to the subject and acquire MR image data from the subject. The system also includes a computer system programmed to control the plurality of gradient coils and the RF system to perform a multi-pass, chemical shift-encoded (CSE)-MRI acquisition of imaging data from the subject and perform a complex, joint estimation of phase terms in the imaging data for each pass of the multi-pass, CSE-MRI acquisition to account for concomitant gradient (CG)-induced phase errors of different passes. The computer system is also programmed to generate at least one of a proton density fat fraction (PDFF) estimate or an R2* estimate that is unbiased by CG-induced phase errors using the phase terms and communicate a report that includes at least one of the PDFF estimate or the R2* estimate.

In accordance with another aspect of the disclosure, a method is provided that includes acquiring multi-pass, chemical shift-encoded (CSE)-MRI imaging data of a subject and performing a complex, joint estimation of phase terms in the imaging data for each pass of the multi-pass, CSE-MRI imaging data to account for concomitant gradient (CG)-induced phase errors of different passes. The method also includes generating at least one of a proton density fat fraction (PDFF) estimate or an R2* estimate that is unbiased by CG-induced phase errors using the phase terms and communicating a report that includes at least one of the PDFF estimate or the R2* estimate.

The foregoing and other aspects and advantages of the invention will appear from the following description. In the description, reference is made to the accompanying drawings, which form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 3A is a graph of interleaved, multi-pass readout gradients in accordance with the present disclosure.

FIG. 3B is a graph showing concomitant gradients that are by-products of the X, Y, and Z imaging gradients, including the readout gradients illustrated in FIG. 3A.

FIG. 3C is a graph showing the continuous phase error accumulation caused by the concomitant gradients of FIG. 3B in each pass.

FIG. 3D is a graph showing the phase error at the echo times of a multi-pass acquisition, viewed sequentially, relative to the points from FIG. 3C.

FIG. 3E is a graph showing the phase error at the echo times of a multi-pass acquisition, viewed sequentially within passes, relative to the points from FIG. 3C.

FIG. 8A is a graph showing that the fitting method provided herein accurately estimates independent pass-specific phase terms encompassing both background phase and CG induced phase errors in a water phantom.

FIG. 8B is a graph correlated with the graph of 8B that assists in illustrating that the fitting method provided herein accurately estimates independent pass-specific phase terms encompassing both background phase and CG induced phase errors in a water phantom.

DETAILED DESCRIPTION

Figure 1:
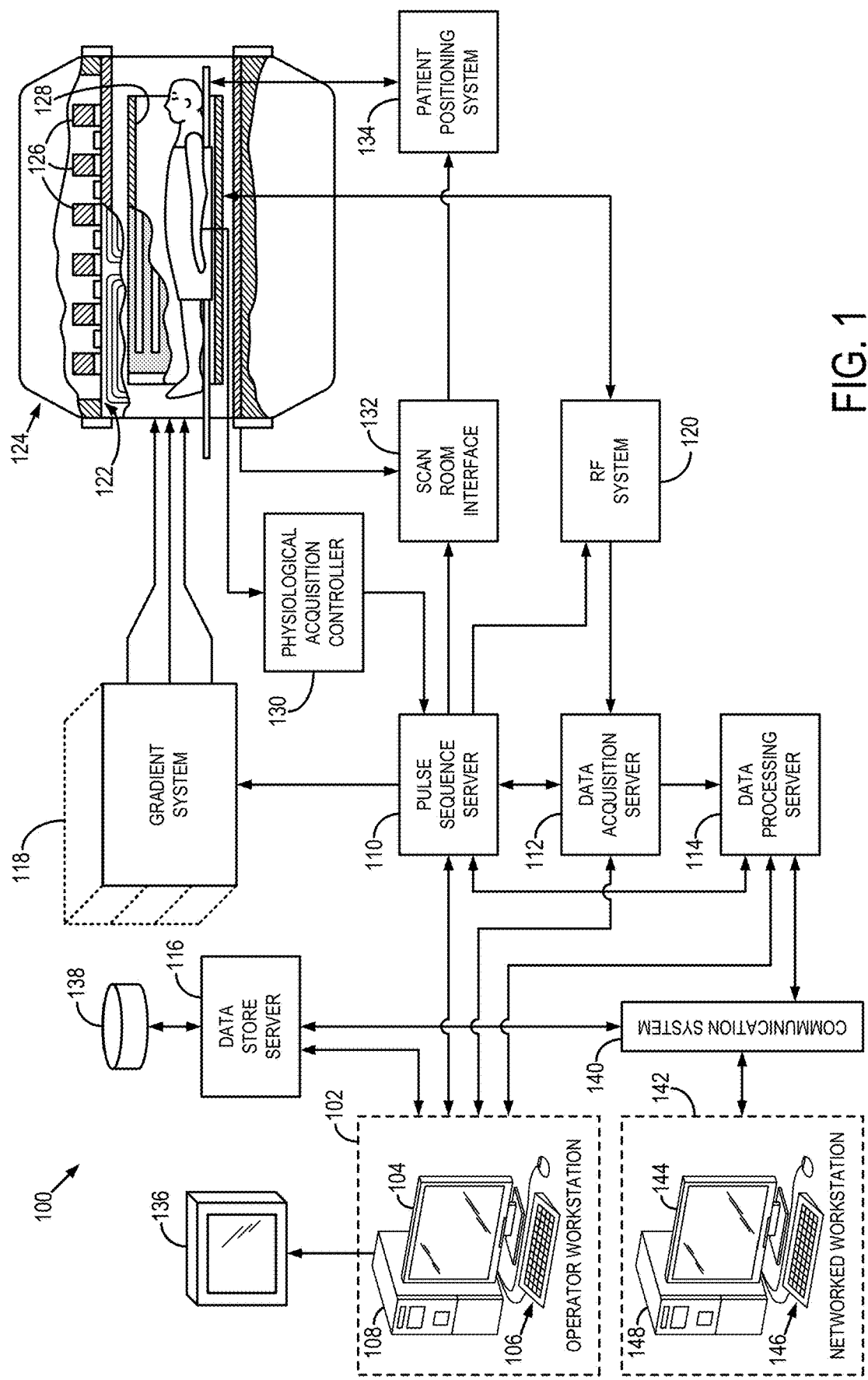
FIG. 1 is a block diagram of an exemplary magnetic resonance imaging ("MRI") system configured in accordance with the present disclosure.

Referring now to FIG. 1, a magnetic resonance imaging (MRI) system 100 is provided that may be configured, programmed, or otherwise utilized in accordance with the present disclosure. The MRI system 100 includes an operator workstation 102, which will typically include a display 104, one or more input devices 106 (such as a keyboard and mouse or the like), and a processor 108. The processor 108 may include a commercially available programmable machine running a commercially available operating system. The operator workstation 102 provides the operator interface that enables scan prescriptions to be entered into the MRI system 100. In general, the operator workstation 102 may be coupled to multiple servers, including a pulse sequence server 110; a data acquisition server 112; a data processing server 114; and a data store server 116. The operator workstation 102 and each server 110, 112, 114, and 116 are connected to communicate with each other. For example, the servers 110, 112, 114, and 116 may be connected via a communication system 140, which may include any suitable network connection, whether wired, wireless, or a combination of both. As an example, the communication system 140 may include both proprietary or dedicated networks, as well as open networks, such as the internet.

The pulse sequence server 110 functions in response to instructions downloaded from the operator workstation 102 to operate a gradient system 118 and a radiofrequency (RF) system 120. Gradient waveforms to perform the prescribed scan are produced and applied to the gradient system 118, which excites gradient coils in an assembly 122 to produce the magnetic field gradients $G_x$, $G_y$, $G_z$ used for position encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil (not shown in FIG. 1), in order to perform the prescribed magnetic resonance pulse sequence. Responsive magnetic resonance signals detected by the RF coil 128, or a separate local coil, are received by the RF system 120, where they are amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the scan prescription and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. Each RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components (i.e., $M=\sqrt{I^2+Q^2}$) and the phase of the received magnetic resonance signal may also be determined according as the inverse tangent of the Q component over the I component (i.e., $\phi=\tan^{-1}(Q/I)$).

The pulse sequence server 110 also optionally receives patient data from a physiological acquisition controller 130. By way of example, the physiological acquisition controller 130 may receive signals from a number of different sensors connected to the patient, such as electrocardiograph (ECG) signals from electrodes, or respiratory signals from a respiratory bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, such that no data is lost by data overrun. In some scans, the data acquisition server 112 does little more than pass the acquired magnetic resonance data to the data processor server 114. However, in scans that require information derived from acquired magnetic resonance data to control the further performance of the scan, the data acquisition server 112 is programmed to produce such information and convey it to the pulse sequence server 110. For example, during prescans, magnetic resonance data is acquired and used to calibrate the pulse sequence performed by the pulse sequence server 110. As another example, navigator signals may be acquired and used to adjust the operating parameters of the RF system 120 or the gradient system 118, or to control the view order in which k-space is sampled.

The data processing server 114 receives magnetic resonance data from the data acquisition server 112 and processes it in accordance with instructions downloaded from the operator workstation 102. Such processing may, for example, include one or more of the following: reconstructing two-dimensional or three-dimensional images by performing a Fourier transformation of raw k-space data; performing other image reconstruction techniques, such as iterative or backprojection reconstruction techniques; applying filters to raw k-space data or to reconstructed images; generating functional magnetic resonance images; calculating motion or flow images; and so on.

Images reconstructed by the data processing server 114 are conveyed back to the operator workstation 102. Images may be output to operator display 112 or a display 136 that is located near the magnet assembly 124 for use by attending clinician. Batch mode images or selected real time images are stored in a host database on disc storage 138. When such images have been reconstructed and transferred to storage, the data processing server 114 notifies the data store server 116 on the operator workstation 102. The operator workstation 102 may be used by an operator to archive the images, produce films, or send the images via a network to other facilities.

The MRI system 100 may also include one or more networked workstations 142. By way of example, a networked workstation 142 may include a display 144, one or more input devices 146 (such as a keyboard and mouse or the like), and a processor 148. The networked workstation 142 may be located within the same facility as the operator workstation 102, or in a different facility, such as a different healthcare institution or clinic. The networked workstation 142 may include a mobile device, including phones or tablets.

The networked workstation 142, whether within the same facility or in a different facility as the operator workstation 102, may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may exchanged between the data processing server 114 or the data store server 116 and the networked workstations 142, such that the data or images may be remotely processed by a networked workstation 142. This data may be exchanged in any suitable format, such as in accordance with the transmission control protocol (TCP), the internet protocol (IP), or other known or suitable protocols.

Figure 2:
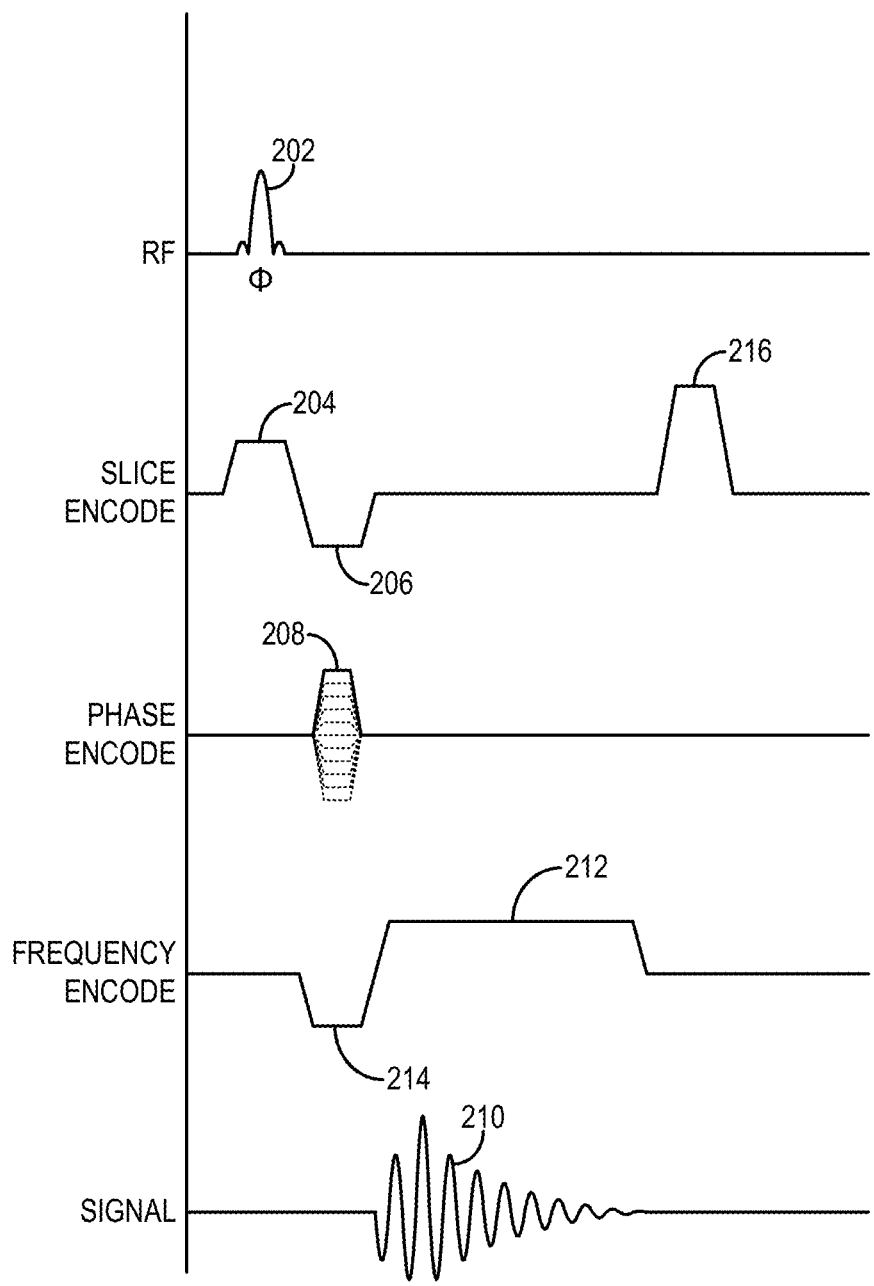
FIG. 2 is a graphic representation of an exemplary pulse sequence for directing the MRI system of FIG. 1.

The above-described MRI system can be used to implement a variety of pulse sequences to effectuate desired imaging studies. As will be described herein one category of pulse sequence is the gradient echo (GRE) sequence and variations thereof, such as the spoiled gradient echo (SGRE) pulse sequence. An example pulse sequence that can be employed to direct the MRI system to acquire data in accordance with some embodiments described in the present disclosure is illustrated in FIG. 2. This example pulse sequence is an SGRE pulse sequence. In some settings, the pulse sequence can include a radio frequency (RF) excitation pulse 202 that is played out in the presence of a slice-selective gradient 204 in order to produce transverse magnetization in a prescribed imaging slice. The RF excitation pulse 202 may be a spatially selective RF excitation pulse, a spectrally selective RF excitation pulse, or both. The slice-selective gradient 204 includes a rephasing lobe 206 that acts to rephase unwanted phase dispersions introduced by the slice-selective gradient 204, such that signal losses resultant from these phase dispersions are mitigated. Following excitation of the nuclear spins in the prescribed imaging slice, a phase encoding gradient 208 is applied to spatially encode a magnetic resonance signal, representative of a gradient-recalled echo 210, along one direction in the prescribed imaging slice. A readout gradient 212 is also applied after a dephasing gradient lobe 214 to spatially encode the signal representative of the echo 210 along a second, orthogonal direction in the prescribed imaging slice. The signal representative of the echo 210 is sampled during a data acquisition window.

Unlike a standard gradient echo sequence, the SGRE sequence removes a second phase encoding gradient applied after the readout gradient 212 that is a mirror image of the phase encoding gradient 208 at the beginning of the pulse sequence. Instead, the pulse sequence concludes with the application of a spoiler gradient 216 that spoils the remaining transverse magnetization. The pulse sequence is repeated and the amplitude of the phase encoding gradient 204 is stepped through a set of values such that k-space is sampled in a prescribed manner. As will be described, the sampling may be Cartesian or non-Cartesian. After the desired amount of data have been acquired for the prescribed imaging slice, the pulse sequence is again repeated a plurality of times (e.g., for each phase-encoding step) while applying a different slice-selective gradient 204 to acquire data from a different imaging slice. This process is repeated until data have been acquired from the desired number of imaging slices.

Concomitant gradients (CG) are magnetic field variations induced as the by-product of the applied imaging gradients 204, 206, 208, 212, 214, 216. For a given position relative to isocenter of the MM bore (x=0, y=0, z=0), the first- and second-order contribution of CGs to the B0 field are given by the following approximation:

$$B_{CG}(x, y, z, t) = \frac{1}{2B_0}\left[G_x^2(t)z^2 + \right.$$ Eqn. (1)

-continued
$$\left. G_y^2(t)z^2 + G_z^2(t)\frac{x^2+y^2}{4} - G_x(t)G_z(t)xz - G_y(t)G_z(t)yz\right];$$

where $G_x(t)$, $G_y(t)$, and $G_z(t)$ are the applied imaging gradients. CGs are zero at isocenter and increase quadratically with distance from isocenter. Notably, equation (1) is an approximation; higher order, spatially dependent terms are also present, although usually ignored.

As used herein, a phase-constrained CSE-MRI signal model for a single voxel from a SGRE acquisition is utilized:

$$s(TE)=|M_0e^{i\phi}(1-\eta+\eta C_F(TE))e^{-R2^*TE}e^{i2\pi\psi TE}$$ Eqn. (2);

where $\eta$ is PDFF, $M_0 e^{i\phi}$ is the complex signal amplitude ($M_0$) and constant phase ($\phi$), $\psi$ is the B0 field map (Hz), $C_F$ is the sum of complex exponentials reflecting a multi-peak spectral model of fat, and TE is the echo time. In one non-limiting example, 6 peaks may be used for the multi-peak spectral model of fat. With this in place, the presence of CGs can be modeled in the SGRE acquisition for a localized voxel as:

$$s_{GC}(x,y,z,TE)=s(TE)e^{-\phi_{CG}(x,y,z,TE)}$$ Eqn. (3);

where $\phi_{CG}$ (x, y, z, TE) is the local (spatially dependent) phase error attributed to concomitant gradients at the voxel given by:

$$\phi_{CG}(x, y, z, TE) = \gamma \int_0^{TE} B_{CG}(x, y, z, \tau)d\tau$$ Eqn. (4)

where $\gamma$ is the gyromagnetic ratio and $B_{CG}$ is as given in equation (1).

With this in mind, some have attempted a CG correction via a calculation of $\phi_{CG}$ for each voxel (as a function of time, position, and gradient waveform) and subsequently demodulate these phase errors from the acquired multi-echo data, as described in Colgan T J, Hernando D, Sharma S D, Reeder S B. The effects of concomitant gradients on chemical shift encoded MRI. Magn. Reson. Med. 2017; 78:730-738 doi: https://doI.org/10.1002/mrm.26461. After calculation, the phase contribution of CGs can be demodulated from the acquired multi-echo data. Even when overcoming the challenge presented by needing to know the gradient waveforms, then one must manage the interdependencies across the pipeline/systems for acquisition and reconstruction to adjust for the CGs.

The present disclosure recognizes that, in single-pass acquisitions, CGs lead to a spatially dependent linear phase ramp that develops across sequential echoes. With conventional fitting using the complex-based signal model given in equation (2) (hereafter referred to as the conventional or common-phase fitting), this linear phase ramp confounds non-linear least squares (NLLS) estimation of B0 field map ($\psi$), but leaves PDFF and R2* estimation unaffected in single-pass acquisitions. However, multi-pass acquisitions introduce a temporal delay between different passes. Off-isocenter, this results in a constant phase offset between interleaved echo trains and a highly non-linear phase error across sequential echoes.

Viewed separately, the passes accrue CG-induced phase errors in parallel: at the same rate but separated by a constant phase offset. Viewed together, the resulting phase error across sequential echoes is highly non-linear for voxels that are off-isocenter. This non-linearity in multi-pass acquisitions introduces echo dependent variation of the signal phase that confounds estimation of B0, PDFF, and R2* using the conventional common-phase fitting.

Specifically, referring to FIGS. 3A-3E, the readout gradient is shown for a 2-pass TIMGE acquisition in FIG. 3A. Then, in FIG. 3B, CGs can be seen as by-products of the X, Y, and Z imaging gradients. FIG. 3C shows the phase error in degrees. FIG. 3D shows that the CG phase errors across time interleaved multi-echo gradient echoes cause spatially-dependent non-linear phase accumulation across sequential TEs. However, FIG. 3E shows that these phase errors are linear across sequential TEs in the same pass and parallel between passes. Thus, as will be described, the present disclosure provides a system and method that can account for the difference between CG-induced phase errors of different passes by including pass-specific phase terms in the CSE-MRI signal model.

As a solution for unbiased PDFF and R2* estimation in the presence of CG-related phase errors in multi-pass acquisitions, the present disclosure provides a modified SGRE signal model for any given voxel, as:

$$s(TE,p) = M_0 e^{i\phi_p}(1-\eta+\eta C_F(TE))e^{-R2^* \cdot TE} e^{i2\pi \psi^* \cdot TE} \quad \text{Eqn. (5);}$$

where $\phi_p$ is a spatially-varying, pass-specific phase intercept (0th order or constant phase term) for the $p^{th}$ pass. As shown in FIGS. 3A-3D, this solution recognizes that passes accrue CG-induced phase errors in parallel—at the same rate but separated by a constant offset. Thus, independent pass-specific phase terms can be estimated to compensate for the constant phase offset between passes. That is, the present disclosure recognizes that treating the data as sequential in "pass" and incrementing "p" in equation 5, instead of treating the data as sequential in echo time (TE), allows for parameters, such as B0 and TE-dependent CG phase errors to be estimated.

In this way, a variety of accurate clinical parameters can be determined and not corrupted by CGs. Note that in the present disclosure for multi-pass acquisitions, as in single-pass acquisitions, the parallel first-order (time-dependent) phase contributions of CGs will still lead to bias in the B0 field map term, but will not affect the PDFF or R2* estimates. Accordingly, the time-dependent phase term, previously denoted $\psi$, has been adjusted to $\psi^*$ to recognize that, away from isocenter, it now represents the combination of the B0 field map and time dependent CG phase errors. The present fitting technique is referred to here as the independent-phase fitting, for this reason. This is further distinguished from a magnitude fitting, which discards all acquired phase information and fits the magnitude of the acquired data to the magnitude of the signal model, for example, such as a signal model of equation 2. As just one distinction that will be further described, magnitude fitting does not estimate B0 field map ($\psi$) or phase terms.

Figure 4:
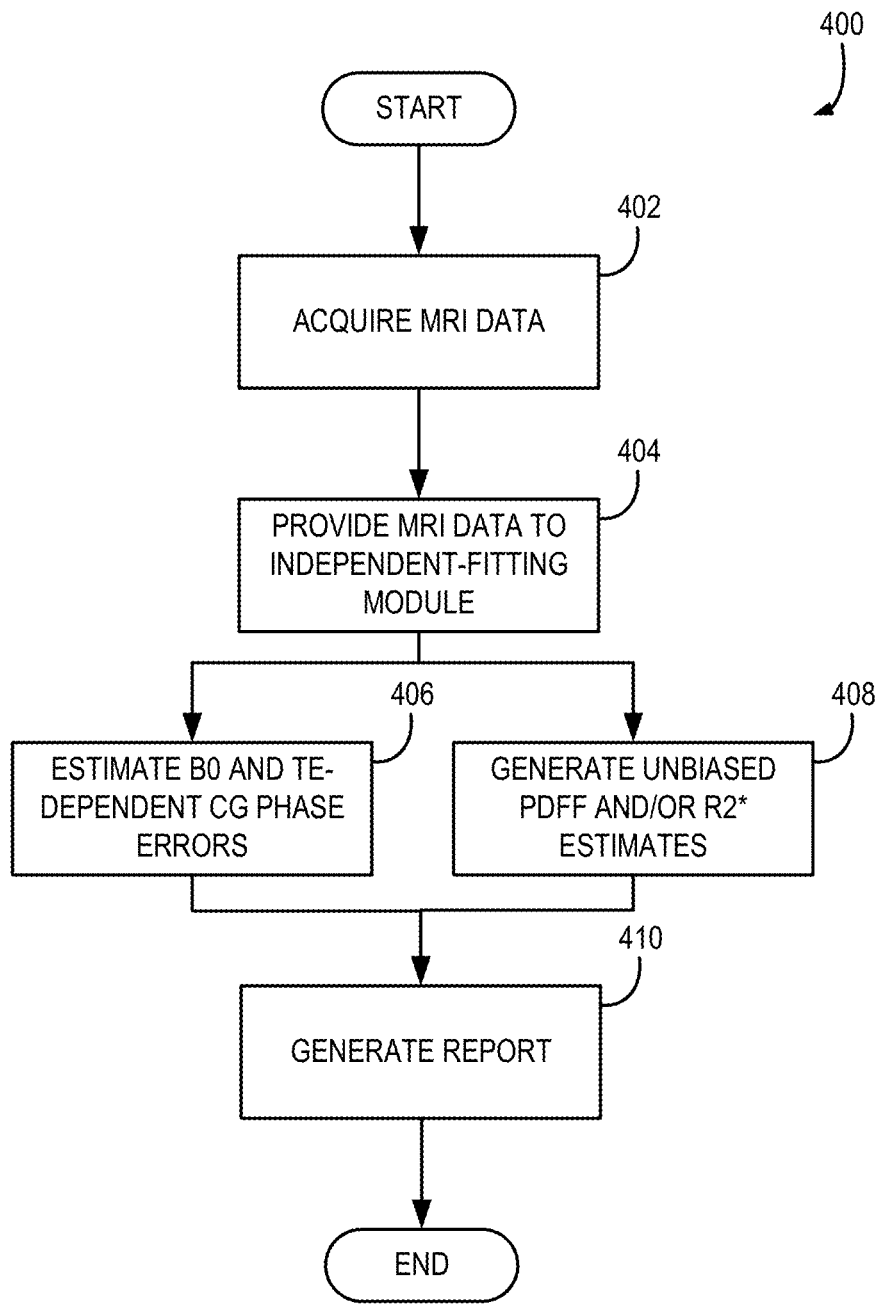
FIG. 4 is flow chart illustrating some non-limiting, example steps of a method in accordance with the present disclosure.

Referring to FIG. 4, a process 400 in accordance with the present disclosure carries these constructs into using the fitting method. The process 400 starts at process block 402 with the acquiring of chemical shift-encoded (CSE)-MRI. As mentioned above, "acquiring" may include controlling an MRI system, such as described above with respect to FIG. 1, to perform a pulse sequence, such as an SGRE pulse sequence described above with respect to FIG. 2. As described above, the echoes may be equally or non-equally spaced. Alternatively, "acquiring" may include accessing CSE-MRI data that was previously acquired and, for example, stored or the like.

At process block 404, the MRI data is provided to an independent-fitting module, that carries out a fitting process, such as described above. At process block 406, the independent-fitting module estimates B0 and TE-dependent CG phase errors together as a time-dependent phase term. To do so, the independent-fitting module can treat the B0 field map strictly as a confounder and generate the estimates of B0 and TE-dependent CG phase errors. As estimated, these terms are inseparable without knowledge of imaging gradients waveforms to calculate the specific contribution of CGs.

As indicated at process block 408, the unbiased PDFF and R2* estimation in the presence of CGs is generated using, for example, equation 5. Then, at process block 410, a clinical report is generated that at least includes the PDFF and/or R2* estimations. For example, PDFF and R2* are the clinically relevant parameters used for diagnosing, staging, and monitoring liver fat (established application) and iron (emerging application). Thus, the report may be generated for a particular study or clinical application, or can be an image or map of PDFF, R2*, or other parameters, including parameters where the accurate estimate of PDFF and R2*, even in the presence of GCs, provides improved clinical value.

Experiments

Cramer-Rao lower bound analysis was used to determine noise performance tradeoffs of the independent-fitting method described herein. Experiments in both phantom and in vivo data were used to test the proposed independent-phase fitting method against the conventional common-phase fitting method (with and without CG correction) and a magnitude fitting method. All phantom and in vivo data presented here were acquired as part of a previously-reported study and reprocessed in the current work as described below. All complex acquired data were reconstructed online to include product eddy current compensation (i.e., linear echo phase correction), coil combination, and nonlinear gradient correction.

Cramer-Rao Lower Bound Analysis

The Cramer-Rao Lower Bound (CRLB) provides a theoretical lower bound on the variance of any unbiased estimator. In this work, CRLBs were used to predict the noise performance of PDFF and R2* estimation using the conventional phase fitting, magnitude fitting, and phase fitting provided herein. In this way, the impact of the additional degree of freedom in the proposed signal model on noise performance can be assessed.

CRLBs were calculated for conventional phase fitting method and the phase fitting methods provided herein, using equations (2) and equations (5), respectively. The CRLB for the magnitude fitting method was calculated from the magnitude of equation (2). All CRLBs were calculated for 6 equally spaced echoes at 3.0 T with the following simulated parameters: PDFF=10%, R2*=45 s$^{-1}$, $\psi^*$=0 Hz, $M_0$=100, and $\phi_1$=0. For the CRLB of the phase fitting provided herein, we arbitrarily let $$\phi_2 = \frac{\pi}{15} (i.e., 12°).$$

In practice, these constant phase offsets would be spatially dependent on the background phase and the CG-induced phase error, as determined by equation (4). TE$_1$ and $\Delta$TE were varied independently between 0-3.5 ms and 0.4-2.8 ms, respectively, as input to the CRLB calculations. SNR was defined as $$SNR = \frac{M_0}{\sigma}$$

and fixed at 30.

For the same parameters given above, a series of noiseless simulations were performed to determine the expected bias from each method. Further, a second set of CRLB calculations varied underlying PDFF from 0%-100% and SNR from 0-30 for 6 echoes with echo spacing matching the phantom and in vivo acquisitions ($TE_1$=1.3 ms, $\Delta TE$=1.0 ms).

Phantom Acquisitions

Phantom acquisitions consisted of 3D multi-pass axial acquisitions with two interleaved echo trains and monopolar readout on a 3T clinical MRI system (Discovery MR750, GE Healthcare, Waukesha, Wis.) with a 32-channel phased-array torso coil (NeoCoil, Pewaukee, Wis.). Data were acquired in a homogeneous $NiCl_2$- and NaCl-doped water phantom of dimensions 15.0×14.8×37.2 $cm^3$ with 0% PDFF and homogeneous R2* with the following imaging parameters: 6 echoes, $TE_1$=1.3 ms, $\Delta TE$=1.0 ms, TR=10.6 ms, flip angle=3°, rBW=±125 kHz, FOV=21×21×48 cm, a 128×128×60 matrix size, without parallel imaging, and averaged 12 times to improve SNR. This is an appreciable SNR benefit yielded by the systems and methods of the present disclosure and the complex fitting provided herein.

PDFF and R2* estimates from the conventional phase fitting (with and without CG correction), magnitude fitting, and the phase fitting provided herein were compared. Additionally, estimates of the independent pass-specific phase terms were compared to the CG induced constant phase errors predicted by linear regression of equation (4). These independent pass-specific phase estimates ($\phi_p$, equation (5)) were also compared to the background phase term ($\phi$, equation (2)—common initial phase of fat/water) estimated using the conventional fitting method after CG correction.

In-Vivo Acquisitions

Acquisitions in the liver (female, age 26) and thigh (male, age 25) of healthy volunteers were conducted to test the performance of the above-described systems and methods in the presence of CG-induced phases errors on PDFF estimation. Reference acquisitions were acquired at isocenter (where CG errors are minimal/zero). Additional acquisitions were acquired 12 cm (liver) and 14 cm (thigh) off isocenter by moving the table in the superior direction. For the off-isocenter acquisitions, imaging gradient amplitudes were recorded and used to apply CG corrections for comparison. PDFF (liver) and R2* (thigh) estimates from the conventional, magnitude, and proposed fittings were compared. These acquisitions used the same MR system, coil, and data processing as the phantom acquisitions.

The liver acquisitions used a 3D multi-pass axial acquisition with two interleaved echo trains (3 echoes) for a total of 6 echoes, using a monopolar readout. Other acquisition parameters included: $TE_1$=1.3 ms, $\Delta TE$=1.0 ms, flip angle=3°, rBW=±166.67 kHz, TR=7.4 ms, FOV=35×35×48 $cm^3$, 192×160×48 matrix, and parallel imaging acceleration factors of 2 in the phase direction and 1.5 in the slice direction. Liver acquisitions were collected in single end-expiration breath holds (26 seconds). The thigh acquisitions used a matching protocol with the following exceptions: rBW=±142.86 kHz, TR=10.6 ms, FOV=21×21×48 $cm^3$, 128×128×60 matrix, no parallel imaging, and 5 signal averages to improve SNR.

A final analysis reprocessed data from 29 clinical patients, acquired as part of a previously reported study, and compared PDFF and R2* estimates from the conventional, magnitude, and fittings methods provided herein. Data were acquired using a typical clinical protocol acquired at isocenter with two interleaved echo trains (3 echoes) for a total of 6 echoes, using monopolar readout. Other parameters included: $TE_1$=1.2 ms, $\Delta TE$=1.0 ms, TR=8.02 ms, flip angle=3°, rBW=±125 kHz, FOV=40×32×25.6 $cm^3$, 256×144×32 matrix, using corner-cutting and parallel imaging (acceleration factors of 2 in both the phase and slice directions).

Regions-of-interest (ROI) were placed in each of the nine Couinaud segments of the liver in the reconstructed PDFF and R2* maps by an experienced radiologist according to a standardized method proposed by Campo et al. at Campo C A, Hernando D, Schubert T, Bookwalter C A, Pay A J V, Reeder S B. Standardized Approach for ROI-Based Measurements of Proton Density Fat Fraction and R2* in the Liver. Am. J. Roentgenol. 2017; 209:592-603 doi: 10.2214/AJR.17.17812. Bland-Altman analysis was used to compare the proposed fitting method with the conventional and magnitude fittings. Coefficients of variation (CV) and root-mean-squared-errors (RMSE) were calculated. CV was calculated as the standard deviation of the difference between mean values over the average of mean values, as a percentage.

Results

Cramér-Rao Lower Bound Analysis

Figure 5:
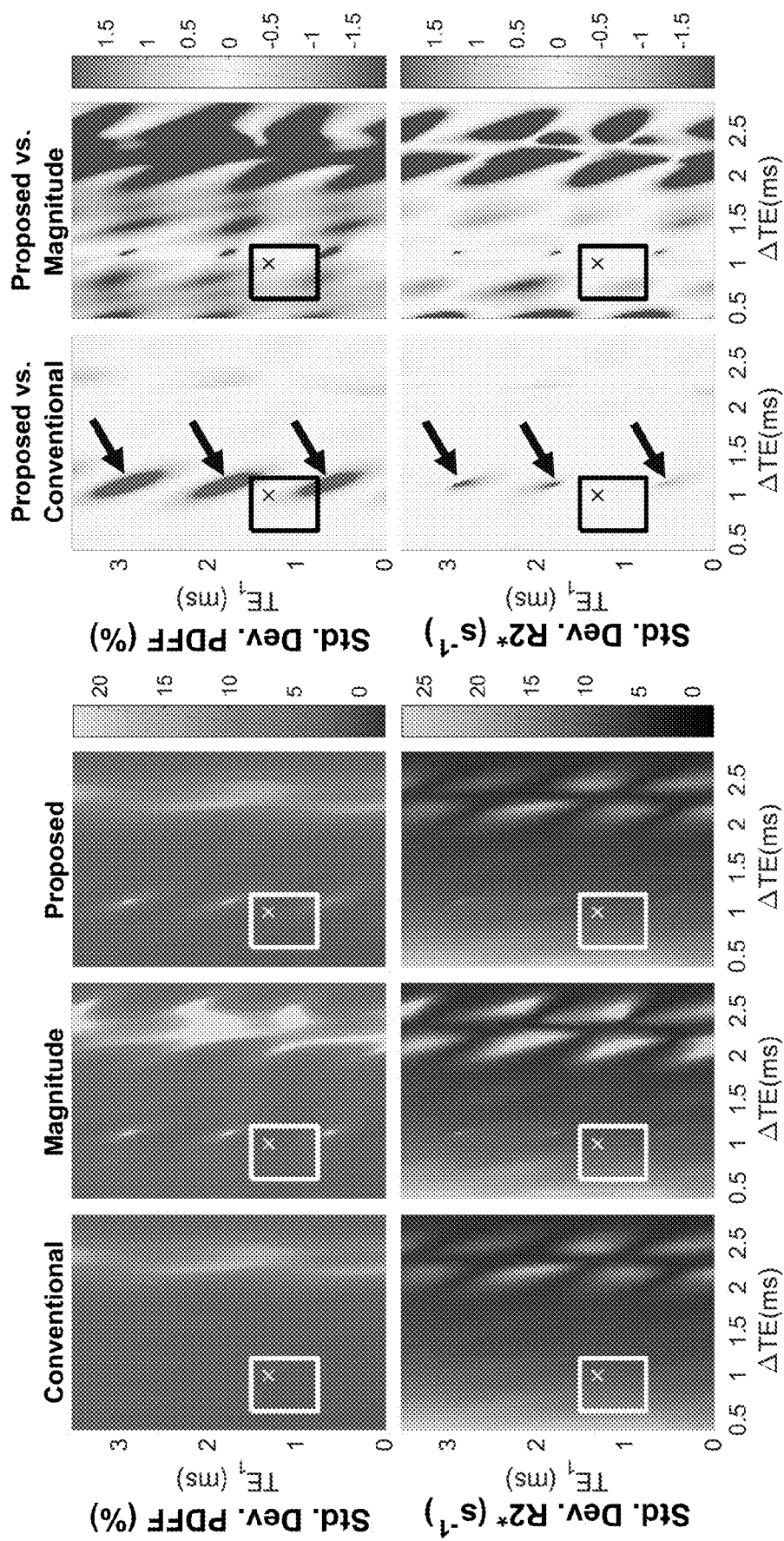
FIG. 5 is a set of correlated images showing noise performance of an independent-phase fitting method such as described herein, compared against the conventional common-phase and magnitude fittings.

FIG. 5 shows CRLB results for PDFF and R2* estimation from 6 equally spaced echoes using the conventional fitting, magnitude fitting, and proposed fitting. Compared to magnitude fitting, FIG. 5 shows that the proposed fitting method demonstrates an improvement in noise performance within the range of common echo time combinations. The noise performance of the independent-fitting method is similar to that of conventional fitting for most echo time choices; however, it does introduce additional echo time constraints, as seen in FIG. 5. At these specific echo time combinations, fat and water are in quadrature (90° out of phase) and the delay between echoes of an individual echo train are approximately equal to the phase cycling period of the main fat peak relative to water. These echo time combinations result in acquisitions where the information needed to enable fat-water separation is largely carried by the phase difference between echoes of different passes. As the independent-fitting method decouples the phase between passes, it incurs a noise performance penalty. Note that for these echo time combinations the conventional fitting method, if not corrected CGs, will still return biased estimates of PDFF and R2*.

Calculations not shown here for brevity confirmed that these results were identical for different constant phase offset between time-interleaved passes demonstrating that the CRLB results are independent of physical location.

Phantom Acquisitions

Figures 6, 7:
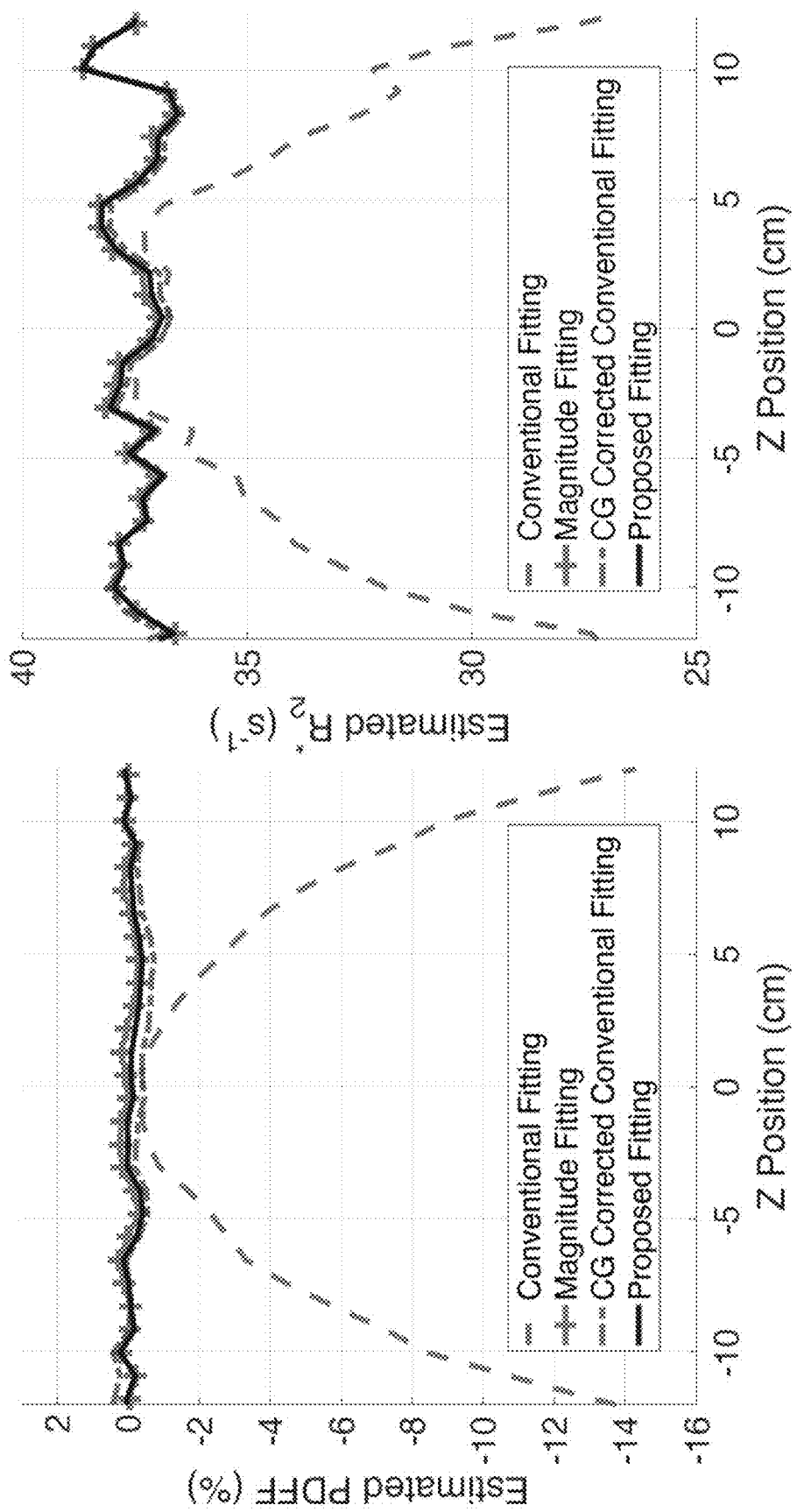
FIG. 6 is a graph showing that the independent-phase reconstruction in accordance with the present disclosure removes significant errors in PDFF estimation caused by CG-induced phase errors.
FIG. 7 is a graph showing that the multiple-phase reconstruction in accordance with the present disclosure removes significant errors in R2* estimation caused by CG-induced phase errors.

A 3D multi-pass axial acquisition in a doped-water phantom was used to test the performance of the proposed reconstruction method on PDFF and R2* estimation. FIG. 6 shows PDFF and R2* estimation results along a profile in the z-direction through the middle of the water phantom. The conventional fitting resulted in PDFF errors over 10% (absolute PDFF) and up to ~10 $s^{-1}$ underestimation of R2* within +/−12 cm from isocenter in the z-direction. However, the proposed fitting results in PDFF estimation errors less than 1% and uniform R2* across the phantom profile. Both conventional fitting after CG correction and magnitude fitting estimates were in close agreement to the proposed fitting method.

FIGS. 8A and 8B show the estimated pass-specific phase terms ($\phi_p$, equation (5)) compared to both the predicted constant CG-induced phase errors and the background phase term ($\phi$, equation (2)) estimated after CG correction. As expected, the pass-specific phase terms accurately estimate the sum of both CG-induced constant phase errors and the common background phase, removing both as confounders to PDFF and R2* estimation in the uniform water phantom.

In-Vivo Acquisitions

Figure 9:
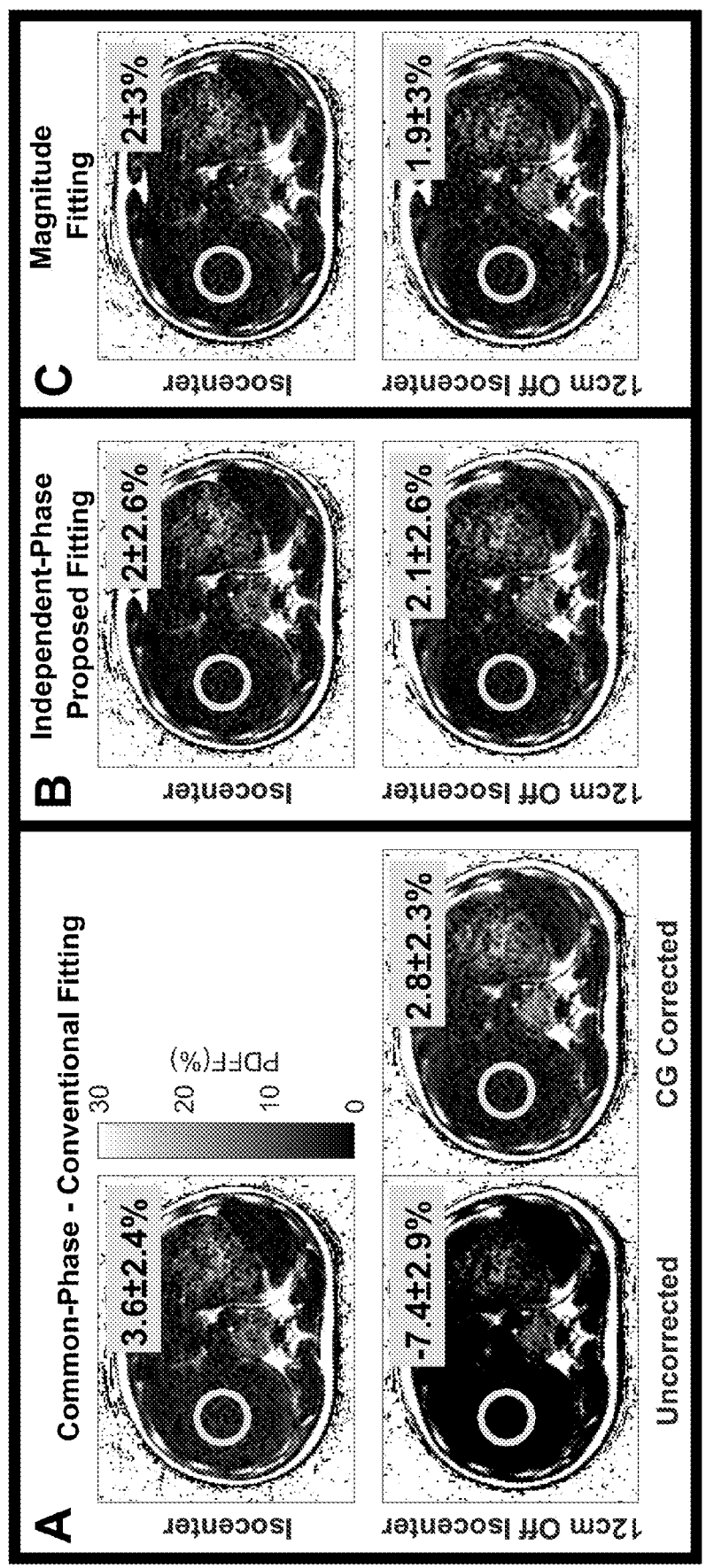
FIG. 9 is a set of correlated images showing that independent-phase fitting in accordance with the present disclosure can avoid significant PDFF estimation errors caused by concomitant gradients for off-isocenter multi-pass acquisitions.
Figure 10:
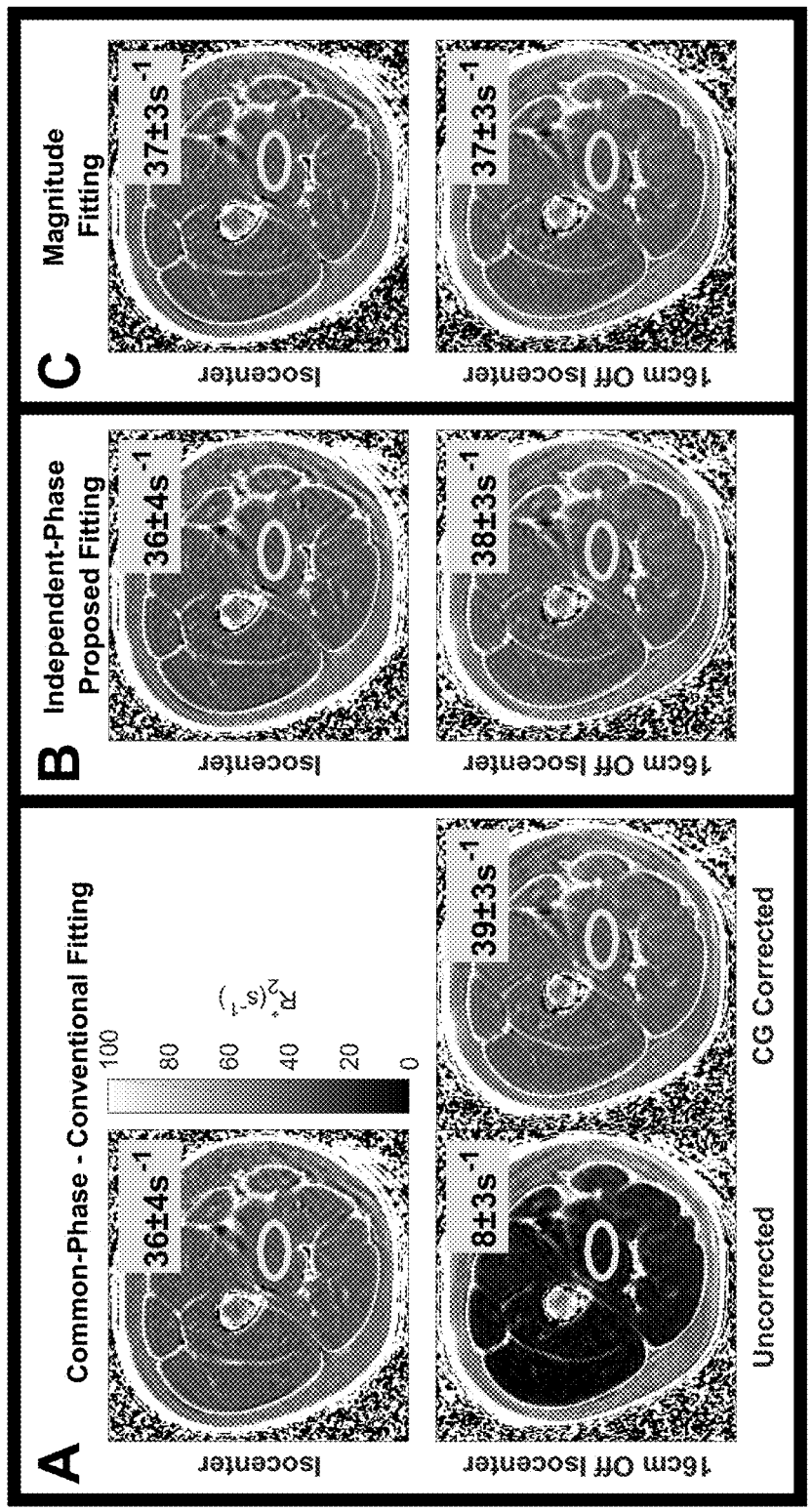
FIG. 10 is a set of correlated images showing that independent-phase fitting in accordance with the present disclosure can avoid significant R2* estimation errors caused by concomitant gradients for off-isocenter multi-pass acquisition.

Repeated multi-pass acquisitions on and off isocenter in the liver and thigh of two healthy volunteers were used to test the performance of the proposed fitting for PDFF and R2* estimation in the presence of CG-induced phase errors. Reconstructed PDFF maps from the liver acquisition and fittings (both on and 12 cm from isocenter), with average PDFF values of co-localized ROIs, are shown in FIG. 9. Similarly, reconstructed R2* maps from the thigh acquisition and fittings (both on and 16 cm from isocenter), with average R2* values of co-localized ROIs, are shown in FIG. 10. In the liver and thigh in vivo experiments, the PDFF and R2* maps estimated by the proposed fitting method away from isocenter were free from CG related phase errors and were comparable to the reference maps (i.e., the conventional fitting at isocenter, the CG corrected conventional fitting off isocenter, and the magnitude fittings).

Data collected from 29 clinical patients, using a typical clinical protocol acquired at isocenter, were retrospectively reprocessed and used to compare the proposed fitting against the conventional and magnitude fittings. Using magnitude fitting as a reference, the proposed fitting was shown to reduce absolute PDFF bias by 0.56% on average and reduce the coefficient of variation from 16% to 7.6% compared to the conventional fitting. Similarly, Bland-Altman analysis also showed that R2* bias is minimally reduced by 0.50 $s^{-1}$ on average with a 0.7% improvement in the coefficient of variation.

Thus, as described above, a multi-phase fitting system and method are provided that can be used to create PDFF and R2* measurements corrected for CG-induced phase errors in multi-pass acquisitions with uniformly spaced echoes. This is particularly relevant for clinical CSE-MRI, including at 3.0 T where multi-pass acquisitions are routinely used to achieve high spatial resolution while maintaining optimal echo spacing for water-fat separation. This method permits accurate PDFF and R2* estimation in the presence of CG-induced phase errors, without the need to calculate a CG correction based on imaging gradient waveforms. This makes the proposed fitting method a simple and practical solution, particularly when accurate gradient waveform data are unavailable (e.g., proprietary software or retrospective data).

Hernando described a CSE-MRI mixed magnitude/complex fitting method to address phase errors caused by eddy currents. This mixed magnitude/complex fitting method is described in U.S. Pat. No. 9,625,549, which is incorporated herein by reference in its entirety. That work recognized that an adjustment to the reconstruction method could avoid significant estimation error without correcting the source of the phase error. The systems and methods provided herein can be used to extend upon this past work, by addressing phase errors from an additional confounder—concomitant gradients—by adjusting the parameter fitting algorithm. As an aside, fitting provided herein is compatible with the mixed fitting method proposed by Hernando et al.

As demonstrated herein, an efficient solution for avoiding phase-related errors, including those induced by CGs, is to discard the acquired phase data entirely and perform a magnitude fitting. However, without careful initialization by a complex-based fitting method, measurement of PDFF over the entire 0-100% range is difficult with magnitude-based fitting. Further, noise performance of magnitude fitting is a function of fat content and can vary substantially over the 0-100% PDFF range. Alternatively, as a complex-based fitting our proposed method offers stable fat quantification over the full range of PDFF values with improved noise performance largely independent of underlying fat content.

Importantly, calculation and demodulation of CG-induced phase errors allows for estimation of B0 field map unconfounded by CGs (required for applications like quantitative susceptibility mapping), something the independent-fitting of the present disclosure does not permit. Instead, the systems and methods provided herein treat B0 field map strictly as a confounder and estimates B0 and TE-dependent CG phase errors together as a time-dependent phase term. As estimated, these terms are inseparable without knowledge of imaging gradients waveforms to calculate the specific contribution of CGs. Because PDFF and R2* are the clinically relevant parameters used for diagnosing, staging, and monitoring liver fat (established application) and iron (emerging application), this was viewed as an acceptable tradeoff for not requiring CG calculation and correction.

Thus, as described herein, CG-induced phase errors in multi-pass acquisitions can result in significant PDFF and R2* estimation biases that increase quadratically away from isocenter. The severity is particularly notable for PDFF, with clinically relevant bias and variability across the liver, even when the imaging volume is centered at isocenter. CGs can be calculated and corrected; however, this requires accurate prior knowledge of gradient waveform amplitudes and durations. The independent-phase fitting systems and methods provided herein enables accurate PDFF and R2* quantification in the presence of CG phase errors without prior knowledge of imaging gradient waveforms.

As used in the claims, the phrase "at least one of A, B, and C" means at least one of A, at least one of B, and/or at least one of C, or any one of A, B, or C or combination of A, B, or C. A, B, and C are elements of a list, and A, B, and C may be anything contained in the Specification.

The present invention has been described in terms of one or more preferred embodiments, and it should be appreciated that many equivalents, alternatives, variations, and modifications, aside from those expressly stated, are possible and within the scope of the invention.

The invention claimed is:

1. A magnetic resonance imaging (MRI) system comprising:
   a magnet system configured to generate a polarizing magnetic field about at least a portion of a subject arranged in the MRI system;
   a plurality of gradient coils configured to apply magnetic gradients to the polarizing magnetic field;
   a radio frequency (RF) system configured to apply an excitation field to the subject and acquire MR image data from the subject;
   a computer system programmed to:
      control the plurality of gradient coils and the RF system to perform a multi-pass, chemical shift-encoded (CSE)-MRI acquisition of imaging data from the subject;
      perform a complex, joint estimation of phase terms in the imaging data for each pass of the multi-pass, CSE-MRI acquisition to account for concomitant gradient (CG)-induced phase errors of different passes;
      generate at least one of a proton density fat fraction (PDFF) estimate or an R2* estimate that is unbiased by CG-induced phase errors using the phase terms; and communicate a report that includes at least one of the PDFF estimate or the R2* estimate.

2. The system of claim 1 wherein complex, joint estimation of phase terms is part of a CSE-MRI signal model that includes pass-specific phase terms.

3. The system of claim 1 wherein the multi-pass, CSE-MRI acquisition includes uniformly spaced echoes.

4. The system of claim 1 wherein the polarizing magnetic field has a strength of at least 3.0 Tesla.

5. The system of claim 1 wherein the computer system is further programmed to perform the complex, joint estimation of phase terms without a model of imaging gradient waveforms applied by the plurality of gradient coils when performing the multi-pass, CSE-MRI acquisition.

6. The system of claim 1 wherein the computer is further configured to perform a mixed fitting to compensate for eddy currents induced during the multi-pass, CSE-MRI acquisition.

7. The system of claim 1 wherein the complex, joint estimation of phase terms is configured to account for bias in fat and R2* estimation caused by errors in the MRI signal induced by concomitant gradients during the multi-pass, CSE-MRI acquisition.

8. A method comprising:
acquiring multi-pass, chemical shift-encoded (CSE)-MRI imaging data of a subject;
performing a complex, joint estimation of phase terms in the imaging data for each pass of the multi-pass, CSE-MRI imaging data to account for concomitant gradient (CG)-induced phase errors of different passes;
generating at least one of a proton density fat fraction (PDFF) estimate or an R2* estimate that is unbiased by CG-induced phase errors using the phase terms; and
communicating a report that includes at least one of the PDFF estimate or the R2* estimate.

9. The method of claim 8 wherein acquiring the multi-pass CSE-MRI imaging data includes controlling an MRI system to perform a spoiled gradient echo (SGRE) pulse sequence.

10. The method of claim 9 wherein the SGRE pulse sequence includes uniformly sampling spaced echoes.

11. The method of claim 9 wherein the MRI system has a strength of at least 3.0 Tesla.

12. The method of claim 8 wherein complex, joint estimation of phase terms includes applying a CSE-MRI signal model that includes pass-specific phase terms.

13. The method of claim 8 further comprising performing the complex, joint estimation of phase terms without a model of imaging gradient waveforms applied by the plurality of gradient coils when acquiring the multi-pass, CSE-MRI imaging data from the subject.

14. The method of claim 8 further comprising performing a mixed fitting to compensate for eddy currents induced during acquisition of the multi-pass, CSE-MRI imaging data from the subject.

15. The method of claim 8 wherein the complex, joint estimation of phase terms is configured to account for bias in fat and R2* estimation caused by errors in the MRI signal induced by concomitant gradients during the multi-pass, CSE-MRI acquisition.

16. The method of claim 8 wherein acquiring the multi-pass, CSE-MRI imaging data includes accessing the multi-pass CSE-MRI imaging data from a storage medium.

* * * * *